(12) United States Patent
James et al.

(10) Patent No.: US 9,846,211 B2
(45) Date of Patent: Dec. 19, 2017

(54) OPTIMISED PULSE SEQUENCES FOR EVALUATING SPATIAL FREQUENCY CONTENT OF A SELECTIVELY EXCITED INTERNAL VOLUME

(71) Applicant: Osteotronix Medical PTE Limited, Marina Bay (SG)

(72) Inventors: Timothy W. James, Santa Barbara, CA (US); Lance W. Farr, Swansea (GB); James Rafferty, Godrergraig (GB); David Chase, Santa Barbara, CA (US)

(73) Assignee: Osteotronix Medical PTE Limited, Marina Bay (SG)

( * ) Notice: Subject to any disclaimer, the term of this patent is extended or adjusted under 35 U.S.C. 154(b) by 529 days.

(21) Appl. No.: 14/589,888

(22) Filed: Jan. 5, 2015

(65) Prior Publication Data
US 2015/0153432 A1 Jun. 4, 2015

Related U.S. Application Data

(63) Continuation of application No. PCT/US2013/049167, filed on Jul. 2, 2013.
(Continued)

(51) Int. Cl.
*G01R 33/48* (2006.01)
*G01R 33/483* (2006.01)
(Continued)

(52) U.S. Cl.
CPC ..... *G01R 33/4818* (2013.01); *G01R 33/4833* (2013.01); *G01R 33/5659* (2013.01); *G01R 33/5616* (2013.01); *G01R 33/5617* (2013.01)

(58) Field of Classification Search
CPC ............ G01R 33/4818; G01R 33/4833; G01R 33/5659; G01R 33/5616; G01R 33/5617
See application file for complete search history.

(56) References Cited

U.S. PATENT DOCUMENTS

| | | | |
|---|---|---|---|
| 4,484,138 A | 11/1984 | Bottomley et al. | |
| 4,616,182 A | 10/1986 | Kramer et al. | |
| (Continued) | | | |

OTHER PUBLICATIONS

"International Search Report and Written Opinion of the International Searching Authority dated Dec. 5, 2013, International Application No. PCT/US2013/049167", (Dec. 5, 2013).
(Continued)

*Primary Examiner* — Rodney Bonnette
(74) *Attorney, Agent, or Firm* — Fogg & Powers LLC

(57) ABSTRACT

In a structural analysis using NMR techniques, a method for gathering k-value data from frequency encoded spin echoes generated from internal volumes selectively excited by intersecting 90° and 180° slice selective and refocusing RF pulses and subjected to a read gradient for the purpose of quantifying the spatial frequency content of the selected internal volume without contamination by a FID signal, comprising: acquiring spin echo data such that the FID signal generated by imperfections in the 180° slice selective refocusing RF pulse is attenuated by the read gradient such that any remaining FID signal is spatially encoded with higher k-values than the frequency encoded k-values being recorded for subsequent structural analysis while simultaneously providing for t2 t2* and t1 contrast. Other aspects of the invention are disclosed.

16 Claims, 6 Drawing Sheets

Related U.S. Application Data

(60) Provisional application No. 61/668,472, filed on Jul. 6, 2012.

(51) Int. Cl.
  *G01R 33/565*  (2006.01)
  *G01R 33/561*  (2006.01)

(56) References Cited

U.S. PATENT DOCUMENTS

| | | |
|---|---|---|
| 5,334,936 A | 8/1994 | Machida |
| 5,770,943 A | 6/1998 | Zhou |
| 7,932,720 B2 | 4/2011 | James et al. |
| 2007/0167717 A1 | 7/2007 | James et al. |

OTHER PUBLICATIONS

Jagannathan, NR , "Recent Advances in MR Imaging and Spectroscopy", *Jaypee Brothers Medical Publishers Ltd.* (2005), pp. 4-5.
Mao, Jintong , et al., "Experimental Study of Optimal Selective 180° Radiofrequency Pulses", *Journal of Magnetic Resonance*, vol. 79, (1988), pp. 1-10.

OPTIMISED PULSE SEQUENCES FOR EVALUATING SPATIAL FREQUENCY CONTENT OF A SELECTIVELY EXCITED INTERNAL VOLUME

CROSS-REFERENCE TO RELATED APPLICATIONS

This application is a continuation of International Application No. PCT/US2013/049167 filed Jul. 2, 2013, which claims the benefit of U.S. Provisional Patent Application No. 61/668,472 filed Jul. 6, 2012.

BACKGROUND OF THE INVENTION

1. Field of the Invention

The present invention relates to the field of nuclear magnetic resonance (NMR), and more particularly to structural analysis, including but not limited to structural analysis of living tissue using modifications of NMR techniques.

2. Prior Art

The following terms will be used throughout the text:

1. Prism: A prism is an elongate volume of material from which a signal is measured. The signal varies as a function of position along the prism. Although the form of prism generally referred to in the text has a rectangular cross section, in general it may include shapes of any arbitrary cross-section. Additionally, although the measurement of signal generally referred to in the text is a modification of current MRI techniques, as it is evident to anyone skilled in the art, the signal could also be gathered from a prism volume using other techniques.

2. Profile: A profile is the signal as a function of position along a single direction within a prism. Profiles taken from materials with heterogeneous signal intensity will in general be non-constant and represent a measure of the amount of signal generating material with position in the prism. As an example, this may be presence or absence of material, or material density. However, it could measure any number of properties of the material, but the salient point that the signal versus position gives a measure of some physical property with position along the prism. As is evident to one skilled in the art, the profile could represent any measurable physical property which varies with position.

3. Spatial frequency: In signal processing, many techniques exist for estimating the frequency content of a signal. Generally these signals vary with time. When these techniques are applied to a signal which varies with position, rather than time, the analogue of frequency content is a measure of the frequency of spatial variations along the profile. For the purposes of this discussion, this will be termed the "spatial frequency".

4. Spatial frequency spectrum: A spatial frequency spectrum is a representation of the spatial frequency content of a segment of a profile. It graphically illustrates the relative or absolute amounts of signal present in the segment as a function of spatial frequency.

U.S. Pat. No. 7,932,720, the disclosure of which is hereby incorporated herein by reference, discloses methods of assessing at least one spatial frequency characteristic of a sample of a structure. A representative embodiment of the method can be summarized as: a) subjecting the sample to a magnetic field, b) subjecting the sample to first and second RF excitations to excite a stick shaped region in the sample, c) receiving an echo signal from the stick shaped region while the sample is subjected to a magnetic field gradient, d) taking an inverse transform of the received echo signal to obtain an echo signal intensity in one dimension, e) identifying a region of interest in the echo signal intensity in one dimension, f) windowing the region identified in e) along the stick shaped region to shape the echo signal intensity in the region of interest along the stick shaped region, g) taking a transform of the windowed echo signal intensity in one dimension obtained in f), and h) analyzing the one dimensional spatial frequency content in the transform obtained in g) in order to access a one dimensional spatial frequency distribution within the sample of the structure without having to acquire all of the data required to generate an image generally referred to herein as spatial frequency spectroscopy.

Spatial frequency spectroscopy has the significant advantage of being able to characterize structures at significantly smaller scales than can be achieved using conventional MR imaging techniques. By way of example, in some tissues or disease states of interest, including but not limited to brain tissue, the prism cross-section is required to be made small (for example on the order ~1 mm). The conventional 90 and 180 degree pulses defining these small ~1 mm prism cross-section dimensions are particularly susceptible to effects caused by deviations from a pure 90 or 180 degree pulse during the 90 and 180 slice selection process to define the stick shaped or prism shaped region of interest. These imperfections may cause undesirable artifacts in the data. Smaller cross section prisms suffer more from this effect for at least two reasons. First the signal-to-noise ratio is lower, and second, thin slice selective pulses require more time to produce a reasonable slice selective excitation and the proportion of edge effects to total slice thickness is less favorable than in a slice several mm thick.

The Problem

Selective excitation of inner volume prisms is accomplished in MRI scanners by applying two intersecting slice selective RF pulse excitations in the presence of gradients (see U.S. Pat. No. 7,932,720, the disclosure of which is hereby incorporated herein by reference). The first slice selective excitation is a 90° pulse while the second is a 180° pulse. When the prisms are of sufficiently small cross section, or the slices selected by the gradients are sufficiently thin (less than 4 mm) the following issue is encountered: The profile of the 180° pulse slice select deviates significantly from an ideal rectangular intensity profile (a diagram of the 180° pulse slice select shape is shown in FIG. 1). The thinner the slice gets, the more the slice profile differs from rectangular. This leads to there being a non-trivial portion of the intended 180° slice selection volume being excited by other than a simple refocusing 180° pulse. The material in this off 180° condition will then have a non-trivial transverse magnetization which will produce a free induction decay signal. This is detrimental for at least two key reasons—the first is that material potentially distant from the intended prism volume will produce contributions to the echo signal and corrupt the signal from the intended prism volume. Secondly the signal from this unintentionally excited material will produce "encoded" signals in the echo when the read gradient is applied to disperse the spatial frequencies in the intended direction. This material excited by the imperfections in the 180° pulse has not been pre encoded, so when the receiver is turned on and the read gradient is applied, the material within the prism is encoded as intended at spatial frequencies starting at −k-max and progressing to +k-max, and simultaneously the imperfectly excited material in the 180° selected slice is initially excited at k=0 (zero spatial frequency) and rises as a function of time. Since a k=0 encoded signal is significantly higher in magnitude than non-zero encodes, it produces a large signal at the beginning of the read, corrupting the signal from the prism volume.

FIG. 2 illustrates in detail the pulse sequence and illustrates the problem described above. FIG. 3 presents a schematic diagram illustrating the relative orientations of the 90° and 180° slice selections.

The spatially encoded echo signal from this material is superimposed on the spatially encoded echo signal from the material of interest inside the prism but with different spatial encodes at any given point in time. The large peak at –k-max spatial frequency leads to the impression of a large exponential decay at high negative frequency on the leading edge of the echo. See FIG. 4 for an example of an echo contaminated with FID. This phenomenon is referred to herein as FID leak through.

The invention described here is a method to reduce or eliminate this effect while simultaneously providing for a good signal to noise ratio and retain the ability to incorporate a range of MRI contrast mechanisms.

DETAILED DESCRIPTION OF THE PREFERRED EMBODIMENTS

Figure 1:
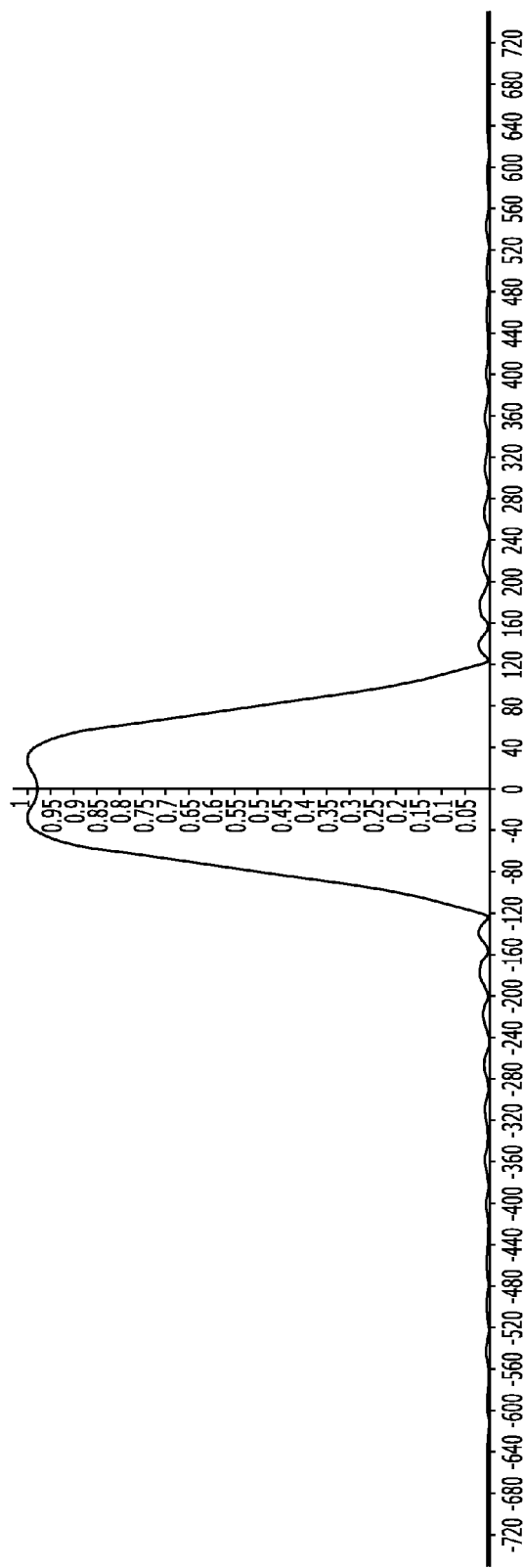
FIG. 1 is a diagram of the 180° pulse slice select shape.
Figure 2:
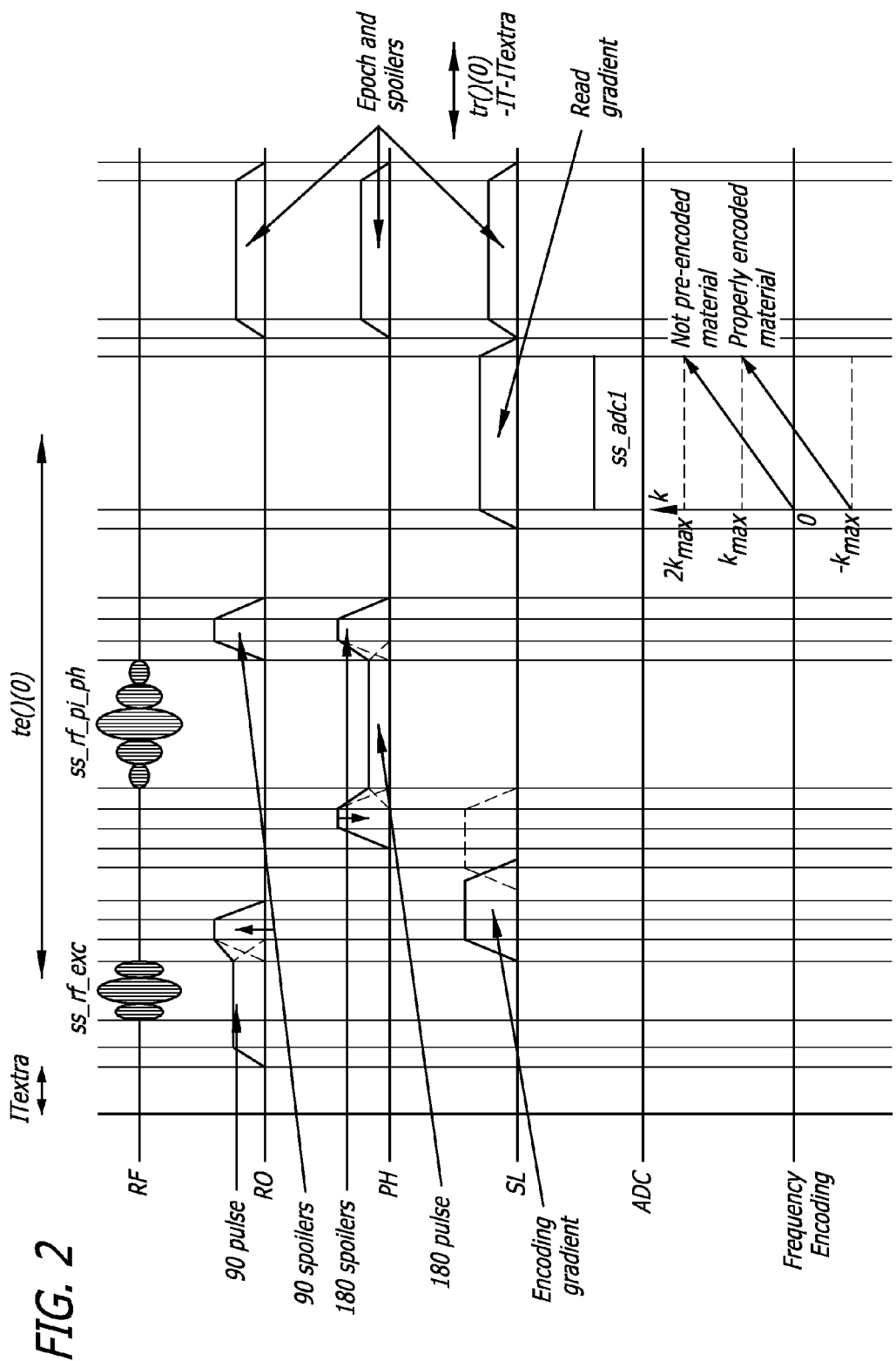
FIG. 2 is a timing diagram for the prism pulse sequence illustrating the relative encodes for the material excited by the initial 90° pulse and the transverse encoded material excited by the 180° pulse.
Figure 3:
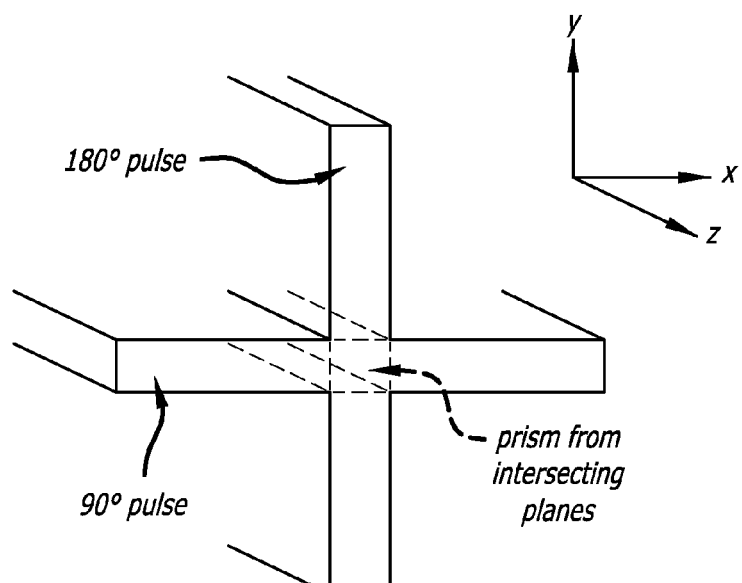
FIG. 3 is a schematic diagram illustrating the relative positions of the intersecting 90° and 180° slice selective pulses forming the prism.
Figure 4:
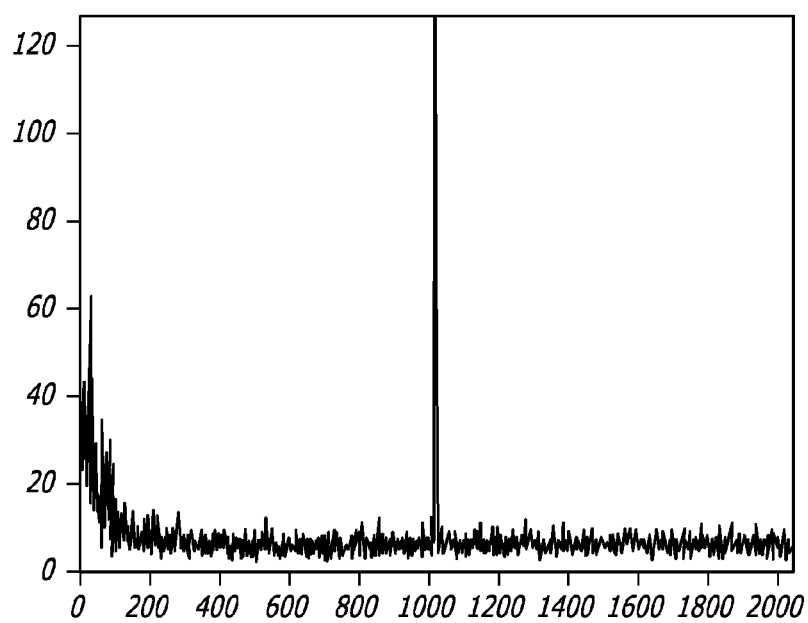
FIG. 4 illustrates the echo when the improperly excited and spatially encoded signal from the 180° excitation superimposed on the properly encoded signal from the intended prism volume.

This disclosure contains details of the problem of artifacts appearing on spatial frequency spectra scans when the prism size is small. The document is organized as follows. First there is an explanation of the artifacts, why they occur (above), what has been done and what will be done to eliminate them from the data. Then there is a description of the pulse sequences that have been developed with the minimization of these artifacts in mind.

There are two key differences between conventional imaging and spatial frequency Spectroscopy. The first is that the spatial frequency analysis in structural analysis is only interested in high spatial frequencies and not at all in the k=0 signal, since conventional imaging can address low spatial frequencies directly by imaging and image analysis. The second is that because spatial frequency analysis is only interested in the high frequency encoded signal, the analysis can arrange the spatial encoding such that the high frequencies of interest fall into any time segment in the echo signal without regard to the time position of the spin echo.

Given the unique attributes of spatial frequency analysis there are a number of methods that either individually or in combination provide properly spatially encoded echo signals without contamination from FID leakage. They fall into two groups, the first being to contrive the spatial encode so that the frequencies of interest in the prism volume appear in the echo where any contribution from FID is spatially encoded at frequencies well outside the range of interest. This can be done either in the direction of the read or in another plane (as in the use of spoiler gradients). The second is to suppress the signal using an outer volume suppression scheme (which is also a form of putting the encode out of band). The third is to use an adiabatic 90° excitation such that the material outside of the 90° slice has its transverse magnetization completely randomized.

Methods to Eliminate FID Leakage from the Desired Portions of the Echo Signal

The following points are techniques that are used to minimize or eliminate the FID leak through.

1. Phase cycling. During a scan a certain number of repeat measurements are taken and then summed to improve the signal to noise ratio. Phase cycling works by adding π to the phase of the 90 pulse, and then reversing the read gradient so the initial measured phase appears to be the same on each subsequent repetition. The material encoded by the 180 pulse that causes the FID leak through possesses transverse magnetization, but is not encoded with this alternating phase. When the alternating read gradient is taken into account, the measured initial phases of the FID leak through are opposite and therefore cancel when the repetitions are summed, leaving only data from material within the prism. This has the advantage that the low k-value encodes are likely to be fairly repeatable from one excitation to the next relative to the higher spatial encodes where biologic or machine motion may make cancellation not so effective. This opens another approach that is to use phase cycling and let the low spatial encodes of the FID leakage fall on high frequency encodes from the prism volume with the advantage that we could use the first part of the echoes.

2. Spoiler gradients. Spoiler gradients, also known as crusher gradients, work by encoding material outside the region of interest to high frequency values so they do not contribute to the measured signal. Experiments have shown that for our technique it is important to have spoiler gradients in the direction of the 180 pulse. The effect of the spoilers can be increased by increasing both the magnitude and the duration of the spoiler gradient. This has the disadvantages of increasing the level of vibration experienced by the patient and increasing the time at which the data is taken, reducing the signal to noise ratio, respectively.

3. Considering data from the trailing edge of the echo only. We have developed analysis techniques that only take data from one side of the echo so one may ignore data from the leading edge or the trailing edge of the echo, as required. We have also created a number of new pulse sequences_that are designed to optimize T1, T2 and T2* contrast while maximizing signal to noise and giving us the ability to discard the data that may be contaminated with FID leak through. These pulse sequences will be described in detail in a following section.

Other aspects of the invention include the use of:
1. Adiabatic 90 pulse
2. Outer volume suppression and coherence pathway analysis
3. Proper orientation of the spoilers Adiabatic 90 Degree Pulse Rather than a standard 90 slice selective pulse, an adiabatic pulse could be used instead. This would have the advantage of being able to selectively suppress magnetic resonance signals from spatial regions outside the 90 slice. This could significantly reduce artifacts in the data, as regions outside the 90 slice selection region, and on the edge of the 180 slice selection region, are the tissues which may be most likely to be responsible for significant artifacts seen in the data. More generally, adiabatic pulses could be used for either the 90 or 180 slice selective pulses.

Outer Volume Suppression

In order to further suppress signals from outside the desired prism volume, outer volume suppression (OVS) bands can also be defined. These may be located to each side of a prism to suppress signal from surrounding tissue which may be excited by an imperfect pulse (for example the 180). In order to perform this, a 90 pulse, combined with a gradient orthogonal to the readout direction of the prism volume, suppresses all longitudinal magnetization from the selected slice. If readout is applied immediately afterward, no signal is returned from the suppressed region. Multiple suppression volumes can be defined, however some longitudinal magnetization may return the longer the delay between outer volume suppression and readout being performed.

Additionally, OVS bands may also be situated wholly or partially within the prism volume to reduce the prism cross-section further. This may be desirable if trying to locate a prism in a narrow anatomical region, where the 90 or 180 pulses cannot define a narrow enough slice on their own.

Spoiler Gradient Orientation

A spoiler gradient pulse is applied to effectively remove the transverse magnetization. This produces a rapid variation of the phase of the transverse magnetization along the direction of the gradient, effectively removing it.

This can be used to remove the undesired signal produced by an imperfect 180—which may be one of the primary causes of artifacts in the data. For this reason the spoiler gradient pulse may applied in the same orientation as the 180 pulse, as well as in the same orientation as the 90 pulse.

A corresponding gradient pulse may be applied prior to the 180 pulse, in order to avoid spoiling the desired transverse magnetization resulting from the initial excitation.

Sequences

Figure 7:
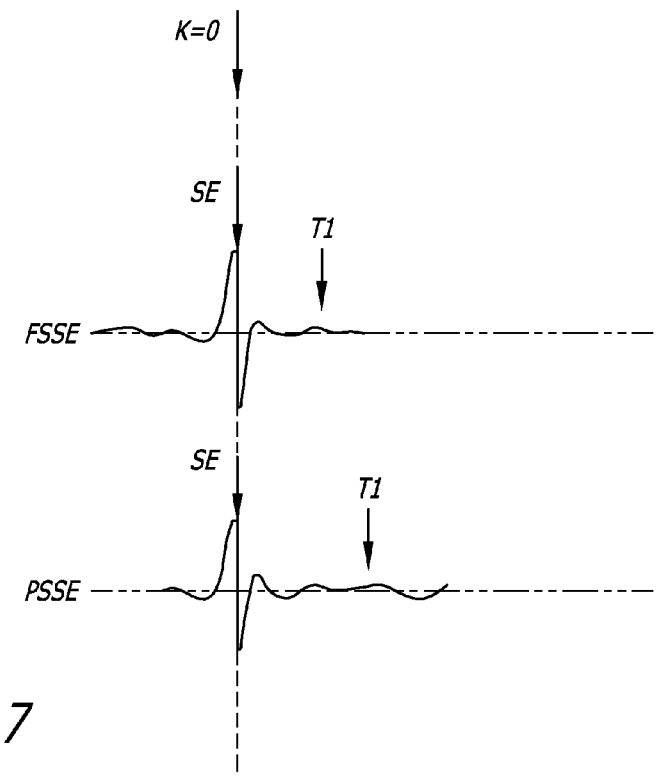
FIG. 7 illustrates full Fourier symmetric echo T1 and partial Fourier symmetric echo T1 contract echoes.
Figure 8:
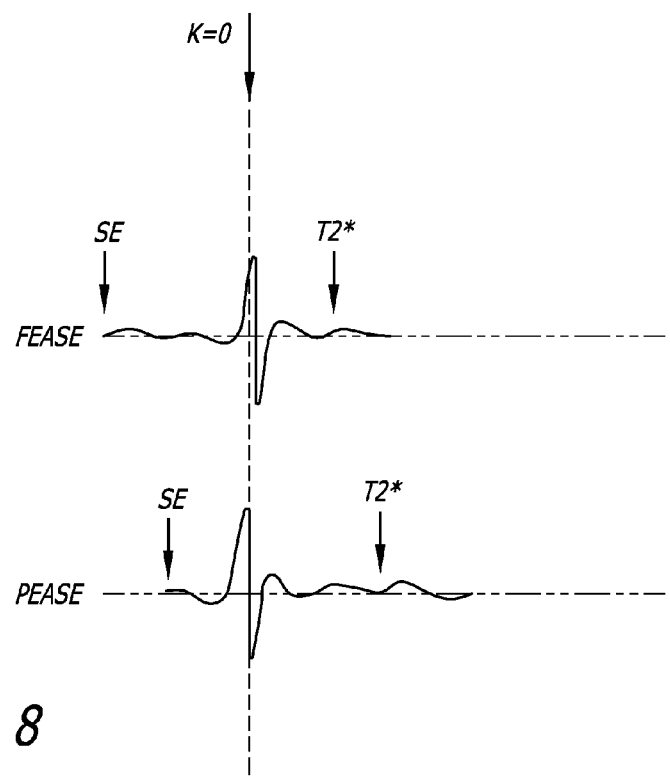
FIG. 8 illustrates Fourier asymmetric echo T2* contrast and partial Fourier asymmetric echo T2* echo.

Given the difficulty of gathering data from a small prism and the desire to acquire prism data with T1, T2 and T2* contrast we have designed pulse sequences that maximize the required contrast and signal to noise ratio while reducing or eliminating the effects of the 180 pulse FID. Also of note is that we are interested in fine structure, or equivalently in high frequency values in the echo. In the following section we describe these pulse sequences, what type of contrast they are designed to have and why they do this (see FIGS. 7 and 8).

Symmetric Spin Echo (SSE)

The SSE is generically a basic MR sequence, however we use it in a novel way. The spin echo coincides with the centre of frequency space which means the high frequency values we are interested in are reasonably close in time to the spin echo. Our analysis allows us to take data from one side of the echo rather than using it all, so we may choose to discard one side (typically the leading edge, or negative frequency values) of the echo if it is contaminated with artifacts.

Symmetric Spin Echo with Gradient Refocused Echo (GRE)

Figure 5:
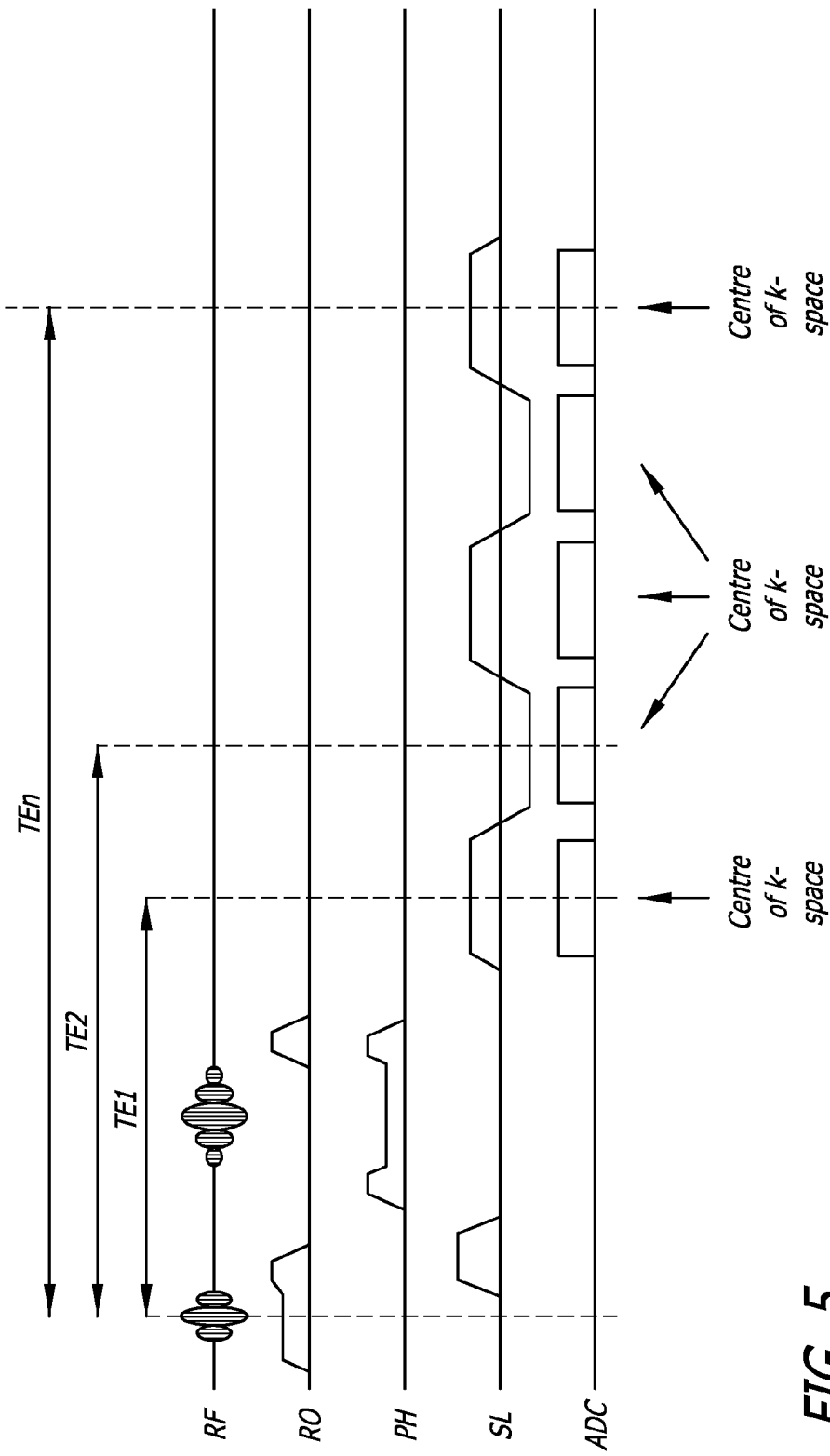
FIG. 5 is a schematic diagram of the pulse sequence for a gradient refocused echo series.

Since we are using both 90 and 180 pulses to define the prism, the echo we will typically get is a spin echo. A gradient echo is desirable for T2* contrast, so we produce one in the following way: A spin echo is produced as above and then refocused by using a gradient reversal rather than another 180 pulse. Since we are interested in the gradient echo we are not required to record the spin echo, but we must produce it as it is then refocused into a gradient echo. Therefore, we may or may not read the spin echo. Since the second echo is refocused the first edge to be recorded corresponds to positive k-space, which is the side that is free of artifacts. A schematic diagram of the pulse sequence producing a gradient refocused echo series is shown in FIG. 5.

Symmetric Spin Echo with Spin Refocused Echo (SRE)

Figure 6:
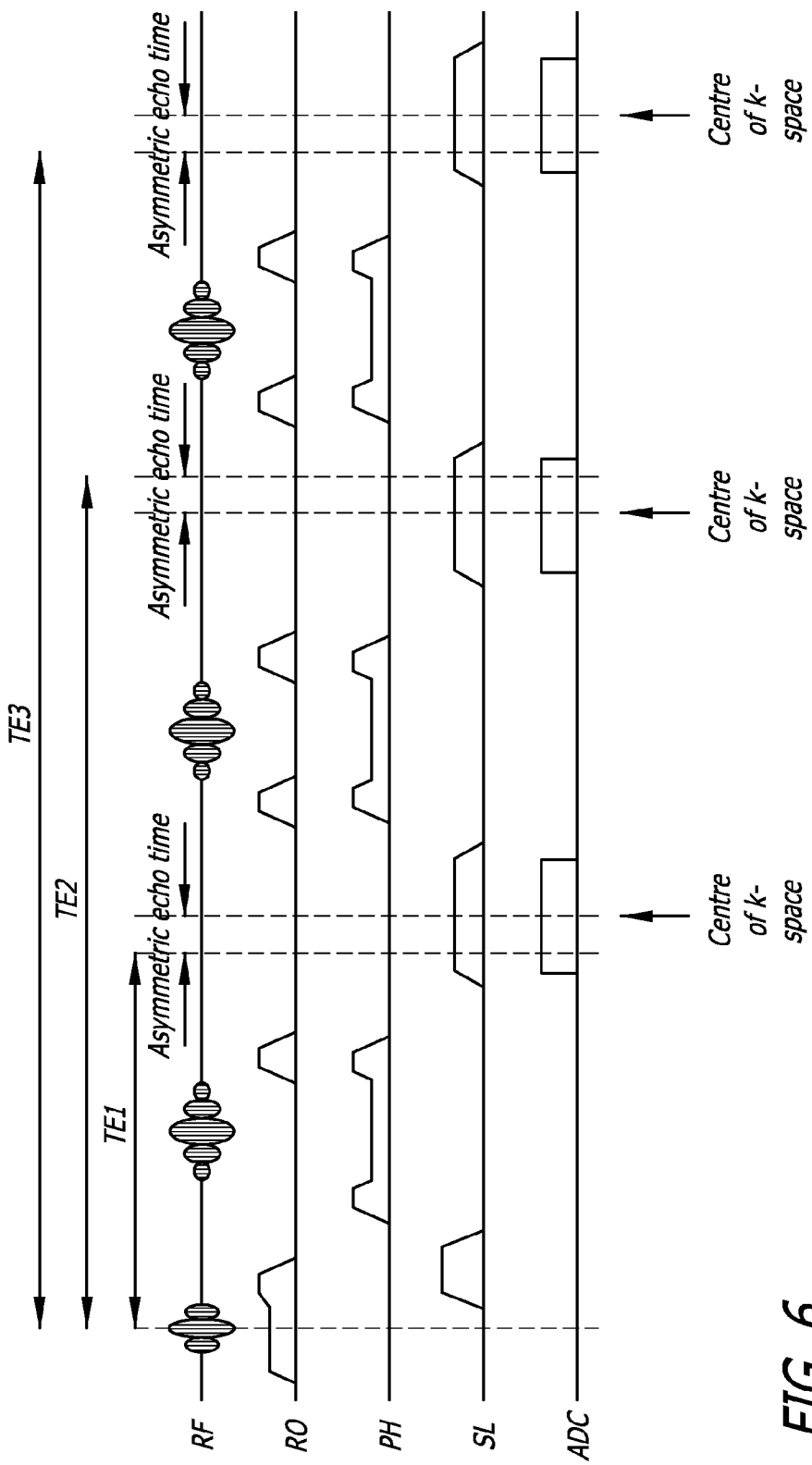
FIG. 6 is a schematic diagram of the pulse sequence for a spin refocused echo series.

The SRE allows us to acquire multiple spin echoes in a single repetition time. The spin refocusing works by acquiring a spin echo in the way described above, and then exciting the prism with another 180 pulse. The spins will be flipped and the de-phasing will be reversed, creating a second echo. This procedure can be repeated as many times as desired. Each successive spin refocused echo is weighted in the same way as the first, so gathering multiple echoes is sensible because nothing is lost. A schematic diagram of the pulse sequence producing a spin refocused echo series is shown in FIG. 6.

Partial Symmetric Spin Echo (PSSE)

Since we are not interested in low frequency values, we may sacrifice some of the low frequency data on the trailing edge of the spin echo described above by moving the r.f. echo and spin echo to an earlier time within the read window so that a partial echo is recorded. As described in a previous section, the FID leak through occurs because material that is not phase encoded outside the prism in the plane of the 180 pulse resonates and is read along with the resonance of the material from the prism. By the time the echo centre is reached the FID leak through is encoding very high frequencies, the signal of which is generally below the noise floor of the machine but prior to this the data may be contaminated with information of a different frequency. Recording only a partial echo allows this unusable contaminated region to extend into the low frequency portion of the trailing edge of the echo, but this part of frequency space is of little interest to us. The advantages of doing this are to make the spin echo and the measurement of our data of interest earlier in time, which improves signal to noise while maintaining the same contrast.

Full Asymmetric Spin Echo (FASE)

In order to get good T2 contrast, it is preferable for the spin echo to be as close as possible to the data of interest. To accomplish this we move the spin echo so that it occurs between 2 r.f. echoes. As before, the data we read is far from the FID affected echo side and we also achieve optimum T2 contrast.

Partial Asymmetric Spin Echo (PASE)

As before, since we are discarding the leading edge of the echo and we are not interested in the low-k portion of the trailing edge of the echo we may move the echo earlier while keeping the read window fixed. The spin echo and the acquisition of data now occurs earlier in time so signal to noise is improved, and the contrast features of the sequence are maintained. We may choose to move the echo so that any or all of the leading edge is no longer read, as the structure sizes of interest are always at the opposite end of the read window.

Full Early Asymmetric Spin Echo (FEASE)

In addition to the GRE sequence described above, we can get T2* contrast with a spin echo sequence by allowing a longer time to pass between the spin echo and reading the data of interest. To facilitate this we place the spin echo prior to the r.f. echo and only analyze the trailing edge. This allows one to keep the time at which the read occurs short, but also to maximize T2* contrast in the structure size range of interest. The 180 FID leak through is suppressed in this sequence because it appears at a higher frequency than we are interested in.

Partial Early Asymmetric Spin Echo (PEASE)

As before, we are not interested in the leading edge at all, and we are also not interested in the low frequency portion of the trailing edge. Therefore we can tolerate some contamination to the low frequency portion of the trailing edge in order to make the acquisition as early as possible.

Thus applying the methods of the present invention in a structural analysis using NMR techniques, methods are disclosed for gathering k-value data from frequency encoded spin echoes generated from internal volumes selectively excited by intersecting 90° and 180° slice selective and refocusing RF pulses and subjected to a read gradient for the purpose of quantifying the spatial frequency content of the selected internal volume without contamination by a FID signal, comprising acquiring spin echo data such that the FID signal generated by imperfections in the 180° slice selective refocusing RF pulse is attenuated by the read gradient so that any remaining FID signal is spatially encoded with higher k-values than the frequency encoded k-values being recorded for subsequent structural analysis while simultaneously providing for t2 t2* and t1 contrast.

The methods may also comprise wherein the frequency encoded spin echoes are Fourier symmetric spin echoes with T1 contrast further comprising gathering k-value data and recording during a record time window for subsequent structural analysis a portion of the k-value data acquired from $k_0$ to k-max comprising k-values in the range of k=0 to the maximum k-value, thereby avoiding the potentially FID contaminated portion of the spin echo prior to $k_0$.

Alternatively, the methods may also comprise wherein the frequency encoded spin echoes are partial Fourier symmetric spin echoes with T1 contrast further comprising gathering k-value data and recording during a record time window for subsequent structural analysis a portion of the k-value data acquired from $k_0$ to k-max comprising k-values in the range of k=0 to the maximum k-value, thereby avoiding the potentially FID contaminated portion of the spin echo prior to $k_0$ and further permitting shortening the spin echo time by as much as two times the time difference between a leading portion of a full Fourier symmetric echo acquisition and a leading portion of the partial Fourier echo acquisition.

Alternatively, the methods may also comprise wherein the frequency encoded spin echoes are Fourier symmetric spin echoes with T2 contrast further comprising gathering k-value data and recording during a record time window for subsequent structural analysis a portion of the k-value data acquired from $k_0$ to k-max comprising k-values in the range of k=0 to the maximum k-value, thereby avoiding the potentially FID contaminated portion of the spin echo prior to $k_0$.

Alternatively, the methods may also comprise wherein the frequency encoded spin echoes are Fourier asymmetric spin echoes with T2* contrast further comprising gathering k-value data and recording during a record time window for subsequent structural analysis a portion of the k-value data acquired from $k_0$ to k-max, thereby avoiding the potentially FID contaminated portion of the spin echo prior to $k_0$.

Alternatively, the methods may also comprise wherein the frequency encoded spin echoes are partial Fourier asymmetric spin echoes with T2* contrast further comprising gathering k-value data and recording during a record time window for subsequent structural analysis a portion of the k-value data acquired from $k_0$ to k-max comprising k-values in the range of k=0 to the maximum k-value, thereby avoiding the potentially FID contaminated portion of the spin echo prior to $k_0$ and further permitting shortening the spin echo time by as much as two times the time difference between a leading portion of a full Fourier symmetric echo acquisition and a leading portion of the partial Fourier echo acquisition.

Thus the present invention has a number of aspects, which aspects may be practiced alone or in various combinations or sub-combinations, as desired. While a preferred embodiment of the present invention has been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. In a structural analysis using NMR techniques, a method for gathering k-value data from frequency encoded spin echoes generated from internal volumes selectively excited by intersecting 90° and 180° slice selective and refocusing RF pulses and subjected to a read gradient for the purpose of quantifying the spatial frequency content of the selected internal volume without contamination by a FID signal, comprising: acquiring spin echo data such that the FID signal generated by imperfections in the 180° slice selective refocusing RF pulse is attenuated by the read gradient such that any remaining FID signal is spatially encoded with higher k-values than the frequency encoded k-values being recorded for subsequent structural analysis while simultaneously providing for t2 t2* and t1 contrast.

2. The method of claim 1 wherein the frequency encoded spin echoes are Fourier symmetric spin echoes with T1 contrast further comprising gathering k-value data for subsequent structural analysis of a portion of the k-value data acquired from $k_0$ to k-max, thereby avoiding the potentially FID contaminated portion of the spin echo prior to $k_0$.

3. The method of claim 2 wherein the Fourier symmetric spin echoes are refocused using a refocusing gradient and further comprising gathering k-value data for subsequent structural analysis of a portion of the k-value data acquired from $k_0$ to k-max in the gradient refocused echo, thereby avoiding the potentially FID contaminated portion of the spin echo prior to $k_0$.

4. The method of claim 2 wherein the Fourier symmetric spin echoes are refocused using a 180° slice selective and refocusing RF pulse and further comprising gathering k-value data for subsequent structural analysis of a portion of the k-value data acquired from $k_0$ to k-max in the echo generated, thereby avoiding the potentially FID contaminated portion of the spin echo prior to $k_0$.

5. The method of claim 1 wherein the frequency encoded spin echoes are partial Fourier symmetric spin echoes with $T_1$ contrast further comprising gathering k-value data for subsequent structural analysis of a portion of the k-value data acquired from $k_0$ to k-max, thereby avoiding the potentially FID contaminated portion of the spin echo prior to $k_0$ and further permitting shortening the spin echo time by as much as two times the time difference between a leading portion of a full Fourier symmetric echo acquisition and a leading portion of the partial Fourier echo acquisition.

6. The method of claim 5 wherein the partial Fourier symmetric spin echoes are refocused using a refocusing gradient and further comprising gathering k-value data for subsequent structural analysis of a portion of the k-value data acquired from $k_0$ to k-max in the gradient refocused echo, thereby avoiding the potentially FID contaminated portion of the spin echo prior to $k_0$.

7. The method of claim 5 wherein the partial Fourier symmetric spin echoes are refocused using a 180° slice selective and refocusing RF pulse and further comprising gathering k-value data for subsequent structural analysis of a portion of the k-value data acquired from $k_0$ to k-max in the echo generated, thereby avoiding the potentially FID contaminated portion of the spin echo prior to $k_0$.

8. The method of claim 1 wherein the frequency encoded spin echoes are Fourier symmetric spin echoes with $T_2$ contrast further comprising gathering k-value data for subsequent structural analysis of a portion of the k-value data acquired from $k_0$ to k-max, thereby avoiding the potentially FID contaminated portion of the spin echo prior to $k_0$.

9. The method of claim 8 wherein the Fourier symmetric spin echoes are refocused using a refocusing gradient and further comprising gathering k-value data for subsequent structural analysis of a portion of the k-value data acquired from $k_0$ to k-max in the gradient refocused echo, thereby avoiding the potentially FID contaminated portion of the spin echo prior to $k_0$.

10. The method of claim 8 wherein the Fourier symmetric spin echoes are refocused using a 180° slice selective and refocusing RF pulse and further comprising gathering k-value data for subsequent structural analysis of a portion of the k-value data acquired from $k_0$ to k-max in the echo generated, thereby avoiding the potentially FID contaminated portion of the spin echo prior to $k_0$.

11. The method of claim 1 wherein the frequency encoded spin echoes are Fourier asymmetric spin echoes with $T_2^*$ contrast further comprising gathering k-value data for subsequent structural analysis of a portion of the k-value data acquired from $k_0$ to k-max, thereby avoiding the potentially FID contaminated portion of the spin echo prior to $k_0$.

12. The method of claim 11 wherein the Fourier asymmetric spin echoes are refocused using a refocusing gradient and further comprising gathering k-value data for subsequent structural analysis of a portion of the k-value data acquired from $k_0$ to k-max in the gradient refocused echo, thereby avoiding the potentially FID contaminated portion of the spin echo prior to $k_0$.

13. The method of claim 11 wherein the Fourier asymmetric spin echoes are refocused using a 180° slice selective and refocusing RF pulse and further comprising gathering k-value data for subsequent structural analysis of a portion of the k-value data acquired from $k_0$ to k-max in the echo generated, thereby avoiding the potentially FID contaminated portion of the spin echo prior to $k_0$.

14. The method of claim 1 wherein the frequency encoded spin echoes are partial Fourier asymmetric spin echoes with $T_2^*$ contrast further comprising gathering k-value data for subsequent structural analysis of a portion of the k-value data acquired from $k_0$ to k-max, thereby avoiding the potentially FID contaminated portion of the spin echo prior to $k_0$ and further permitting shortening the spin echo time by as much as two times the time difference between a leading portion of a full Fourier symmetric echo acquisition and a leading portion of the partial Fourier echo acquisition.

15. The method of claim 14 wherein the partial Fourier asymmetric spin echoes are refocused using a refocusing gradient and further comprising gathering k-value data for subsequent structural analysis of a portion of the k-value data acquired from $k_0$ to k-max in the gradient refocused echo, thereby avoiding the potentially FID contaminated portion of the spin echo prior to $k_0$.

16. The method of claim 14 wherein the partial Fourier asymmetric spin echoes are refocused using a 180° slice selective and refocusing RF pulse and further comprising gathering k-value data for subsequent structural analysis of a portion of the k-value data acquired from $k_0$ to k-max in the echo generated, thereby avoiding the potentially FID contaminated portion of the spin echo prior to $k_0$.

* * * * *